United States Patent [19]
Saari

[11] 3,979,693
[45] Sept. 7, 1976

[54] CRYSTAL-CONTROLLED OSCILLATOR HAVING SINUSOIDAL AND SQUARE-WAVE OUTPUT SIGNALS

[75] Inventor: Veikko Reynold Saari, Spring Lake Heights, N.J.

[73] Assignee: Bell Telephone Laboratories, Incorporated, Murray Hill, N.J.

[22] Filed: Aug. 29, 1975

[21] Appl. No.: 609,163

[52] U.S. Cl................................ 331/61; 331/108 D; 331/109; 331/116 R; 331/183
[51] Int. Cl.²...................... H03B 5/36; H03K 3/26
[58] Field of Search.................. 331/61, 108 D, 109, 331/116 R, 158, 159, 183

[56] References Cited
UNITED STATES PATENTS

| | | | |
|---|---|---|---|
| 3,649,850 | 3/1972 | Davis | 331/116 R X |
| 3,649,929 | 3/1972 | Thompson | 331/61 |

Primary Examiner—Siegfried H. Grimm
Attorney, Agent, or Firm—James W. Anable; Richard B. Havill

[57] ABSTRACT

A precision crystal-controlled oscillator circuit with provision for separate sinusoidal and square-wave output signals which can be realized as a silicon integrated circuit without the use of external capacitors or resistors is disclosed. Two feedback loops are utilized in addition to the oscillating loop. The first feedback loop maintains the gain of the oscillation loop at substantially unity when the amplitude of the oscillation is at a predetermined level, thereby ensuring both spectral purity and amplitude stability of the sinusoidal output signal. The second feedback loop maintains the duty cycle of the square-wave output signal substantially equal to 50 percent by controlling the circuit operation to equally space the signal zero crossings at the input of the square-wave output stage.

19 Claims, 5 Drawing Figures

CRYSTAL-CONTROLLED OSCILLATOR HAVING SINUSOIDAL AND SQUARE-WAVE OUTPUT SIGNALS

BACKGROUND OF THE INVENTION

This invention relates to crystal-controlled oscillator circuits and more particularly to a crystal-controlled oscillator realizable as a silicon integrated circuit having both sinusoidal and square-wave outputs with direct-coupled automatic gain control and direct-coupled control of the square-wave output signal duty cycle.

In the past, many oscillator circuits have been realized, including crystal-controlled oscillators and oscillators which provide both a sinusoidal and square-wave output signals. With the advent of silicon integrated circuit technology, one of the prime goals of the circuit designer has been the realization of such oscillator circuits with few or, ideally, no discrete circuit components. The state-of-the-art oscillators, however, have not achieved this goal without sacrificing performance characteristics such as frequency range, frequency stability, spectral purity of the sinusoidal output signal, or compromising signal characteristics of the square-wave output signal such as rise and fall times or duty cycle stability.

It is accordingly one object of this invention to realize a crystal-controlled oscillator which includes automatic gain control to provide a precise frequency sinusoidal output signal of high spectral purity and includes duty cycle control to provide a precise square-wave output signal while simultaneously satisfying the constraints imposed by current integrated circuit technology. Thus a preferred embodiment of this invention comprises a silicon integrated circuit which can be mounted with a crystal within a single miniature circuit package.

SUMMARY OF THE INVENTION

This and other objects are achieved in accordance with this invention by an oscillator circuit comprising a crystal-controlled oscillator stage which includes automatic gain control (AGC) provisions, an AGC control circuit responsive to oscillator stage sinusoidal signal excursions which exceed a predetermined magnitude, and a duty cycle control stage which forms a control loop orthogonal to the AGC control loop for balancing the differential stage of the oscillating stage. In the preferred embodiment, the circuit topology employed in this invention permits the utilization of silicon integrated junction capacitors to thereby realize an integrated circuit which does not require external capacitors in the filter network of either the AGC or duty cycle control circuits.

More specifically, the oscillator stage of this invention comprises a broad band differential amplifier circuit with an external crystal feedback loop wherein oscillation is sustained at the frequency of the mode of lowest resistance in the piezoelectric crystal. The oscillator stage includes AGC control capability in which a controlled current source determines the differential amplifier emitter current and hence the gain of the oscillating loop.

The AGC control circuitry of this invention includes, in typical embodiment, two distinct circuit paths. The first path supplies a potential representative of the negative peaks of the oscillator stage sinusoidal output signal and the second path supplies a potential representative of the positive peaks of the oscillator stage sinusoidal output signal. These potentials are connected to the base and emitter electrodes of a transistor in a manner which causes the transistor to conduct whenever the magnitude of the oscillator stage sinusoidal output signal exceeds that level which corresponds to unity gain of the oscillation loop. This current is amplified and filtered and fed back to control the emitter circuit current source of the oscillator stage differential amplifier. The sinusoidal output signal is supplied by a push-pull emitter follower circuit which is driven by the sinusoidal output signal of the oscillator stage.

The square-wave output signal is typically generated by a circuit stage which includes the cascade arrangement of a clipper circuit, an NPN differential amplifier, a PNP differential amplifier, and a push-pull output circuit. Duty cycle control is effected by a circuit stage which includes a differential amplifier circuit for sensing the signal imbalance in the NPN differential amplifier circuit of the square-wave output stage. The output signal of the duty cycle control differential amplifier stage is a substantially filtered signal representative of the circuit imbalance in the differential amplifier circuit of the square-wave output stage and is connected to a transistor which provides amplification and further filtering. The resulting dc signal is fed back to the input terminals of the differential amplifier of the oscillator stage to control the bias in a manner which rebalances the signals in the oscillator stage differential amplifier so as to equally space the differential signal zero crossings at the input terminals of the square-wave output stage differential amplifier.

DETAILED DESCRIPTION

Figure 1:
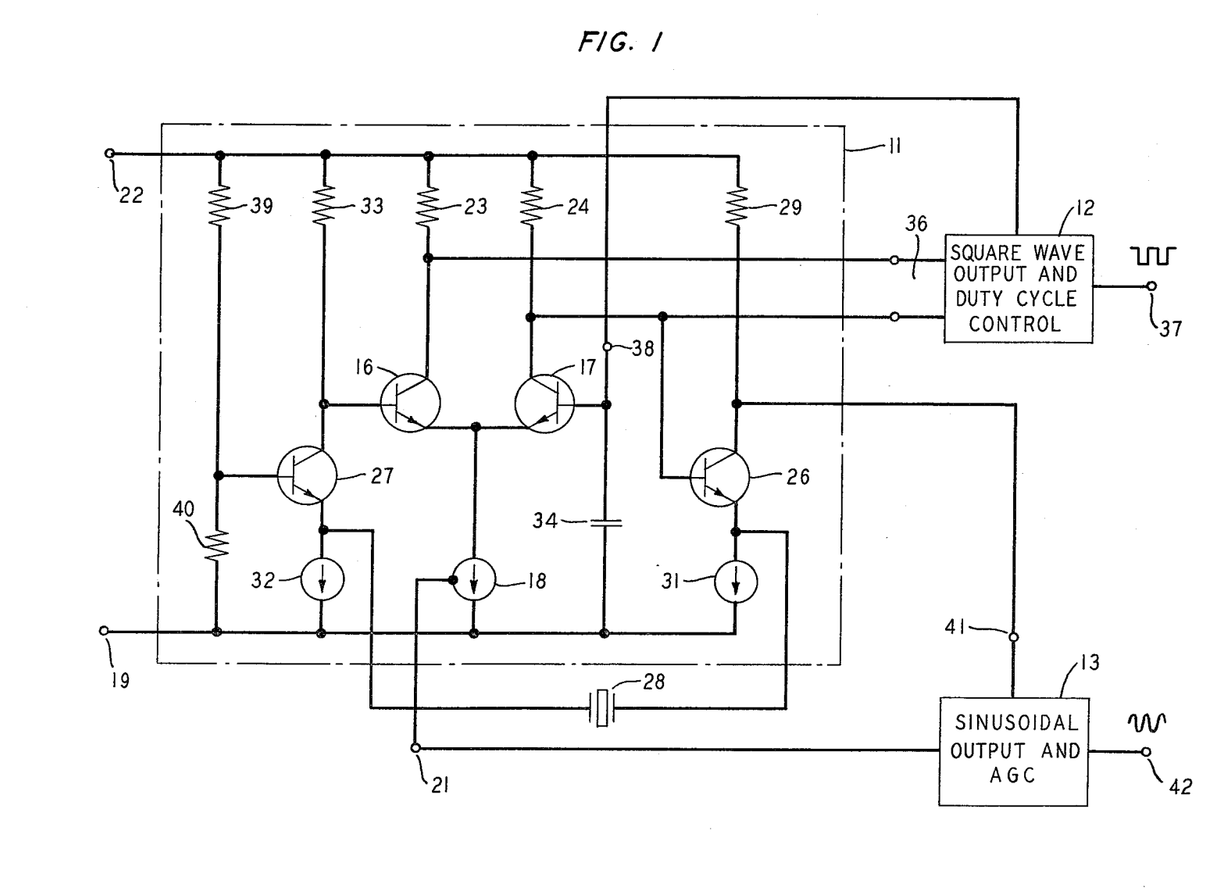
FIG. 1 is a partial schematic, partial block diagram which illustrates the broader aspects of this invention.

As depicted in FIG. 1, the oscillator circuit of this invention comprises oscillator stage 11, square-wave output and duty cycle control stage 12, and sinusoidal output and AGC control stage 13. Oscillator stage 11 is a crystal-controlled oscillator which effectively comprises a wideband differential amplifier and a substantially zero phase shift feedback loop which, in turn, includes piezoelectric crystal 28. The wideband differential amplifier, which has substantially zero phase shift at the frequency of oscillation, includes transistors 16 and 17, which are connected to form an emitter-coupled pair. The total emitter current of the emitter-coupled pair is controlled by current source 18 which is connected between the emitter electrodes of transistors 16 and 17 and bias terminal 19. The current produced by current source 18, and thus the gain of the differential emitter-coupled pair, is controlled by an AGC current control signal which is applied to terminal 21. The collectors of transistors 16 and 17 are respectively connected to bias terminal 22 by resistors 23 and 24. Transistors 16 and 17 are biased to establish substantially equal collector currents in each transistor of the emitter-coupled pair.

Oscillation is established by means of positive feedback from the collector electrode of transistor 17 to the base electrode of transistor 16 through the feedback path which includes transistors 26 and 27, and piezoelectric crystal 28. Transistor 26, whose collector electrode is connected to bias terminal 22 via resistor 29, effectively forms an emitter follower circuit which ensures a low ac impedance at one of the crystal terminals. Current source 31 is connected between the emitter electrode of transistor 26 and bias terminal 19 to establish the bias current in transistor 26 and, in conjunction with current source 32, to determine the maximum current in crystal 28. Crystal 28 is connected between the emitter electrodes of transistors 26 and 27. Transistor 27 is effectively a common base stage which maintains a low ac impedance at the second crystal terminal. The emitter electrode of transistor 27 is connected to bias terminal 19 by current source 32, and the collector electrode of transistor 27 is connected to bias terminal 22 via resistor 33. Capacitor 34, connected between the base electrode of transistor 17 and bias terminal 19, imparts a slight rise in the loop gain characteristics at high frequencies. This rise in the gain characteristic improves the oscillating loop phase characteristic, thereby increasing the frequency range over which the phase shift is substantially zero. The capacitance value of capacitor 34 is low enough to permit the use of a junction capacitor in integrated circuit embodiments.

The frequency of oscillation is determined by the frequency characteristics of piezoelectric crystal 28 and the amplifier phase shift. It can be shown that the deviation of the frequency of oscillation from the fundamental frequency, f, of crystal 28 is, to a good approximation, $$\frac{\Delta f}{f} = \frac{1}{2Q_L} \tan \theta$$

where $Q_L$ is the loaded $Q$ of crystal 28 and $\theta$ is the amplifier phase shift when closed loop amplifier gain is substantially unity.

The collector electrodes of transistors 16 and 17 are connected to input terminal pair 36 of square-wave output and duty cycle control stage 12. As will be described in more detail hereinafter, stage 12 typically includes a differential amplifier which amplifies the signal applied to terminal pair 36 and a clipper circuit which generates a trapezoidal signal which approximates a square-wave. The rise and fall times of the trapezoidal signal are improved to obtain a high-quality square-wave signal by an additional differential amplifier stage. The square-wave signal is then amplified by a push-pull stage which precisely establishes the amplitude of the square-wave output signal which is coupled to output terminal 37.

The duty cycle control circuitry typically includes a circuit stage which senses the imbalance in the base-to-emitter voltages of the second differential amplifier of the square-wave output circuit. The signal produced by this circuit is filtered and connected to duty cycle control terminal 38 of oscillator stage 11. Duty cycle control terminal 38 is connected directly to the base electrode of transistor 27. The duty cycle control signal supplied by the control circuit of circuit stage 12 controls the bias currents of transistors 16 and 17 in a manner which dynamically balances the circuit. This balancing or alteration of the normal biasing of the emitter-coupled pair, in turn, balances the base-to-emitter voltages of the second differential amplifier of the square-wave output circuit. In this manner, the duty cycle of the square-wave output signal is maintained substantially equal to 50 percent.

The collector electrode of the emitter follower transistor 26 is connected to input terminal 41 of sinusoidal output and AGC control stage 13. Stage 13 includes AGC control circuitry responsive to the magnitude of the oscillator output signal to form a dc control signal which is connected to oscillator stage terminal 21 to control the magnitude of the current supplied by current source 18. Further, stage 13 includes circuitry for supplying a sinusoidal output signal to terminal 42.

Figure 2:
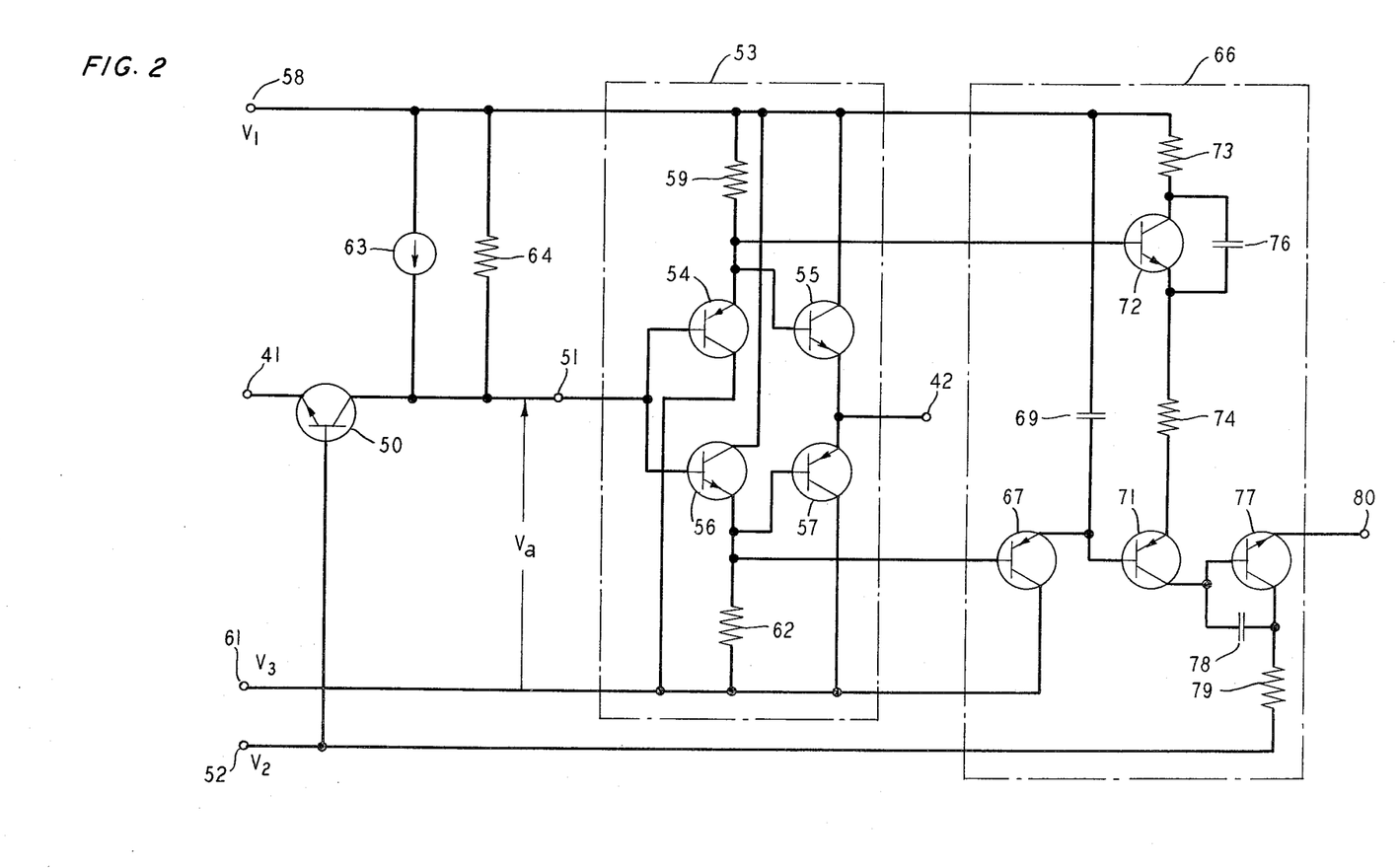
FIG. 2 is a schematic diagram depicting an embodiment of AGC control circuitry and circuitry for supplying a sinusoidal output signal.

FIG. 2 depicts a basic embodiment of sinusoidal output and AGC control stage 13. Transistor 50 is connected in a common base configuration, with the emitter electrode connected to input terminal 41 and the base electrode connected to bias terminal 52. The collector electrode of transistor 50 is connected to input terminal 51 of a push-pull emitter follower circuit which is included within dashed outline 53. The push-pull emitter follower circuit includes transistors 54, 55, 56, and 57, with the base electrodes of transistors 54 and 56 commonly connected to input terminal 51, and the emitter electrodes of transistors 55 and 57 commonly connected to output terminal 42. The collector electrode of transistors 55 and 56 are connected to bias terminal 58, and the emitter electrode of transistor 54 connects to bias terminal 58 via resistor 59. The collector electrodes of transistors 54 and 57 are connected to bias terminal 61, and the emitter electrode of transistor 56 connects to bias terminal 61 via resistor 62.

In operation, a signal comprising a dc bias current with the ac crystal current superimposed thereon is coupled to input terminal 51 of push-pull stage 53 by means of common base transistor 50. Current source 63, connected between bias terminal 58 and the collector electrode of transistor 50, supplies a portion of this bias current. Resistor 64, connected in parallel with current source 63, supplies the remaining portion of the bias current and determines the magnitude of the ac signal voltage at the input of push-pull stage 53. It will be recognized that the use of the parallel combination of current source 63 and resistor 64 permits independent control of the dc voltage at the collector electrode of transistor 50 (denoted as $V_a$ in FIG. 2) and the magnitude of the ac signal developed at input terminal 51 of push-pull stage 53.

Composite connected transistors 56 and 57 conduct over the negative portion of the input signal and composite connected transistors 54 and 56 conduct over the positive portion of the input signal to thereby produce an amplified ac output signal at output terminal 42.

An embodiment of the AGC control circuitry of this invention is contained within dashed outline 66 of FIG. 2. Transistor 67 establishes a dc potential at the base electrode of transistor 71 which is dependent on the dc voltage $V_a$ and the negative peak excursions of the ac crystal signal. Thus, resistor 64 and current source 63 can be utilized to establish a dc potential at the base of transistor 71 which biases transistor 71 on the threshold of conduction when the amplitude of the crystal current is at the desired operating level. In the circuit of FIG. 2, the base electrode of transistor 67 is connected to the emitter electrode of transistor 56 and is thereby biased at a dc potential of $V_a - V_{BE56}$, where $B_{BE56}$ is the voltage across the base-to-emitter junction of transistor 56. The emitter electrode of transistor 67 is connected to the base electrode of transistor 71 and to capacitor 69 which connects to bias terminal 58. Capacitor 69 filters the emitter current of transistor 67 and thereby establishes a partially filtered dc voltage which is substantially equal to $V_a - V_{dc}$, where $V_{dc}$ is substantially the peak voltage of the negative excursions of the ac signal established by resistor 64. In one realization of the embodiment of the circuit of FIG. 2, resistor 64 was selected to establish an ac signal having negative excursions of 400 millivolts or slightly greater than $V_d/2$ when the gain of the oscillating loop was substantially unity. The 400 millivolt negative excursions established the dc potential at the base electrode of transistor 71 substantially equal to $V_a - V_d/2$ where $V_d$ is the dc voltage developed by a single base to emitter junction, e.g., the base-to-emitter voltage of transistor 56.

Transistor 72 is also connected such that it is on the threshold of conduction when the peak-to-peak voltage of the ac signal is approximately equal to $V_d$. Transistor 72 is connected with the base electrode connected to the emitter electrode of transistor 54, the collector electrode connected to bias terminal 58 via resistor 73, and the emitter electrode connected to the emitter electrode of transistor 71 via resistor 74. Capacitor 76, connected between the collector and emitter electrodes of transistor 72, partially filters the short-duration emitter current pulses which occur when the positive-going excursions of applied ac signal approach that level which corresponds to unity gain.

It can be observed that the AGC control circuit of FIG. 2 is established such that virtually no current flows from the emitter electrode of transistor 72 through resistor 74 and the emitter collector path of transistor 71 when the gain of the oscillation loop of oscillator stage 11 (averaged over each cycle of oscillation) is substantially less than unity. Should the magnitude of the oscillator stage output signal increase above the steady-state value which corresponds to unity loop gain, the ac signal developed at terminal 51 increases. This results in a decrease in the dc potential at the base of transistor 71 and a simultaneous increase in the current supplied to the emitter of transistor 71 by transistor 72 during the positive peak excursions of the signal. Under such conditions, the current supplied to the base electrode of transistor 77 increases.

Transistor 77, which has the base electrode connected to the collector electrode of transistor 71, the collector electrode connected to bias terminal 52 via resistor 79, and the emitter electrode connected to AGC output terminal 80, multiplies the collector current of transistor 71 by a factor approximately equal to the beta of transistor 77. Capacitor 78, connected between the base and collector electrodes of transistor 77, provides additional filtering of the AGC control signal. As depicted in FIG. 1, AGC output terminal 80 is connected to current source 18. In view of FIG. 1, it can be noted that when the signal amplitude momentarily increases slightly above the steadystate value, as for example when the bias voltage connected to terminals 22 and 19 momentarily changes, the AGC control signal increases in magnitude, in turn, decreasing the bias currents in transistors 16 and 17. The decrease in bias current results in reduced oscillation loop gain, restoring the signal amplitude to the steady-state value.

In the previously referred to realization of the embodiment of FIG. 2, a suitable AGC signal was obtained utilizing 40 picofarad and 20 picofarad junction capacitors respectively for capacitors 76 and 78. In this embodiment, the dc emitter current of transistor 71 ranged from 0 to 5 microamperes, and the resistor value of resistor 74 was selected to produce a voltage drop substantially less than the voltage typically developed across a forward biased semiconductor junction.

Figure 3:
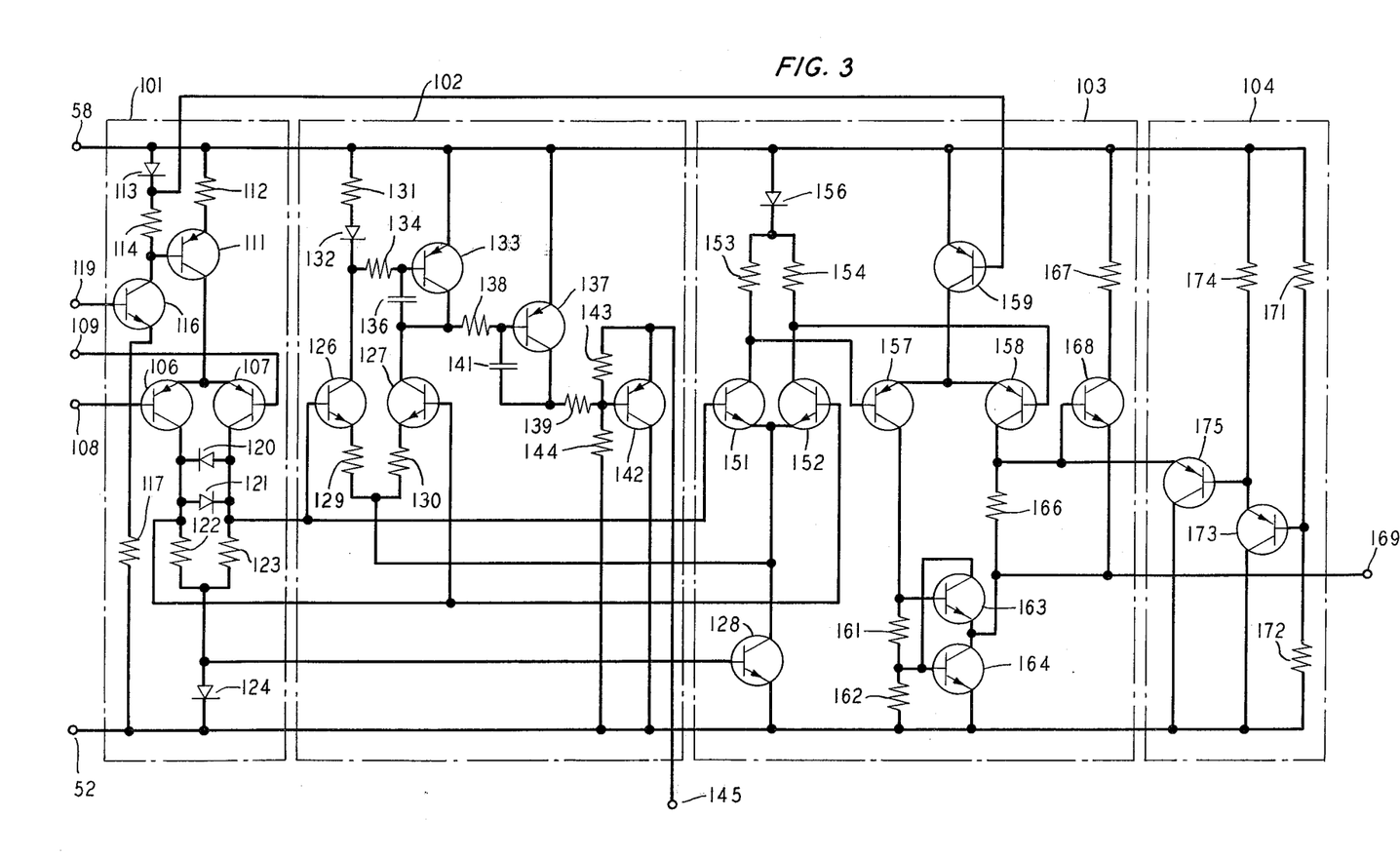
FIG. 3 schematically depicts a square-wave output and duty cycle control circuit in accordance with one embodiment of this invention.

FIG. 3 depicts an embodiment of the square-wave output and duty cycle control circuitry of this invention. As shown in FIG. 3, this circuit comprises four circuit stages which include amplifier and clipper stage 101, duty cycle control network 102, square-wave output stage 103, and clamp circuit 104. Amplifier and clipper stage 101 includes transistors 106 and 107 which form an emitter-coupled pair with the respective base electrodes connected to terminals 108 and 109 which correspond to terminal pair 36 of FIG. 1. Bias current for transistors 106 and 107 is established by the transistor current source which includes transistor 111 and resistor 112. The collector current of transistor 111, and thus the bias current of the emitter-coupled pair, is determined by the circuit branch which includes diode 113, transistor 116, and resistors 114 and 117. Diode 113 and resistor 114 are connected in series between bias terminal 58 and the collector electrode of transistor 116. The base electrode of transistor 116 connects to reference terminal 119, and the emitter electrode of transistor 116 is connected to bias terminal 52 via resistor 117. It can be noted that the reference voltage connected to terminal 119 determines the magnitude of the collector current of transistor 116, which, in turn, determines the bias current in the emitter-coupled pair comprising transistors 106 and 107. Resistors 122 and 123 are connected between the collector electrodes of transistors 106 and 107 and diode 124 is connected between bias terminal 52 and the junction between resistors 122 and 123. Resistors 122 and 123 serves as the load resistors for the emitter-coupled pair and, in conjunction with diodes 120 and 121 which are connected in parallel with opposite poling between the collector electrodes of transistors 106 and 107, establish a clipped sinusoidal or trapezoidal output signal which is supplied to duty cycle control circuit 102 and to square-wave output stage 103.

Square-wave output circuit 103 of FIG. 3 includes two cascaded differential amplifier stages. The first differential stage includes emitter-coupled transistors 151 and 152, with the base electrode of transistor 151 connected to the collector electrode of transistor 107, and the base electrode of transistor 152 connected to the collector electrode of transistor 106. Bias current in the first differential stage is established by current source transistor 128 which also establishes bias in the differential stage of duty cycle control circuit 102. Resistors 153 and 154 are respectively connected to the collector electrodes of transistors 151 and 152 and are also connected to bias terminal 58 via diode 156.

The second differential amplifier stage includes emitter-coupled transistors 157 and 158, the base electrodes of which respectively connect to the collector electrodes of transistors 151 and 152. Bias current for the second differential stage is established by transistor 159, the emitter electrode of which is connected to bias terminal 58 and the collector electrode of which is connected to the emitter electrodes of transistors 157 and 158. The base electrode of transistor 159 is connected to the junction of diode 113 and resistor 114 to thereby establish the combined emitter currents of the second differential stage substantially equal to the collector current of transistor 116. The collector electrode of transistor 157 is connected to bias terminal 52 by series-connected resistors 161 and 162. The base electrode of transistor 164 is connected to the junction of resistors 161 and 162, and the collector electrode of transistor 164 is connected to the collector electrode of transistor 158 by means of resistor 166. The emitter electrode of transistor 164 is connected to bias terminal 52. Transistor 163 is connected with the base electrode connected to the collector electrode of transistor 157, the collector electrode connected to the base electrode of transistor 164, and the emitter electrode connected to square-wave output terminal 169 and to the collector electrode of transistor 158 via resistor 166. Transistor 168 is connected with the base electrode connected to the collector electrode of transistor 158, the emitter electrode connected to square-wave output terminal 169, and the collector electrode connected to bias terminal 58 via resistor 167.

In operation, the differential signal coupled from the collector electrode of transistors 106 and 107 is amplified by the first differential amplifier stage. The differential signal is further amplified by transistor 158 of the second differential stage which drives emitter follower transistor 168 and by transistor 157 which drives transistor 164, with transistor 163 ensuring that transistor 164 does not saturate.

Clamp circuit 104 comprises transistors 173 and 175, with the emitter electrode of transistor 175 connected to the base electrode of transistor 168. The collector electrode of transistor 175 is connected to bias terminal 52, and the base electrode of transistor 175 is connected to the emitter electrode of transistor 173. Resistors 171, 172, and 174 bias transistors 173 and 175 such that the maximum positive swing of the square-wave output signal is limited to a predetermined value, since transistor 175 prevents the base electrode of emitter follower 168 from rising above a certain potential. In addition, clamp circuit 104 is arranged to prevent saturation of transistor 158 for a broad range of operating temperature and bias current.

Duty cycle control network 102 includes a differential amplifier comprising transistors 126 and 127. The base electrodes of transistors 127 and 126 respectively connect to the collector electrodes of transistors 106 and 107, and the emitter electrodes of transistors 126 and 127 connect to the coupled emitters of transistors 151 and 152 and to the collector electrode of transistor 128 by means of resistors 129 and 130. The base electrode of transistor 128 is connected to the anode of diode 124, and the emitter electrode of transistor 128 is connected to bias terminal 52 to form a transistor current source which establishes the bias current in transistors 151 and 152 of square-wave output stage 103 and also establishes the bias current in transistors 126 and 127. The collector electrode of transistor 126 is connected to bias terminal 58 via serially connected resistor 131 and diode 132. Transistor 133, with the collector electrode connected to the collector electrode of transistor 127 and the emitter electrode connected to bias terminal 58, serves as a dc current mirror. The bias level of transistor 133 is established by the bias current in transistor 126, diode 132, and resistors 131 and 134.

In operation, the differential current swing at the collector electrodes of transistors 126 and 127 is coupled to the base electrode of transistor 137 through resistor 138. The differential signal is filtered by capacitor 136 which is connected between the collector and base electrode of transistor 133. The emitter electrode of transistor 137 is connected to bias terminal 58, and the collector electrode of transistor 137 is connected to the base electrode of transistor 142 via resistor 139. Capacitor 141, connected between the collector and base electrodes of transistor 137, provides further filtering of the duty cycle control signal. Transistor 142 is connected with the emitter electrode connected to duty cycle control terminal 145, and the collector electrode connected to bias terminal 52. Resistors 143 and 144 are connected in series between the emitter electrode of transistor 142 and bias terminal 52 with the junction of resistors 143 and 144 connected to the base electrode of transistor 142.

It can be observed that duty cycle control network 102 supplies a control current to the base electrode of transistor 142 which is monotonically related to the difference in the emitter junction voltages of transistors 151 and 152 of square-wave output stage 103. The supplied control current causes a change in the current of resistor 144, thereby causing the potentials at the base electrode of transistor 142 and duty cycle control terminal 145 to rise. Referring to FIG. 1, it can be noted that duty cycle control terminal 145 is connected to control terminal 38 of oscillator stage 11. Thus, in effect, duty cycle control network 102 functions as a voltage regulator, controlling the voltage at the duty cycle control terminal 38 of oscillator stage 11 as a function of the duty cycle of the square-wave output signal. This controlled voltage is coupled to the base electrode of transistor 17 and causes the emitter-coupled pair formed by transistors 16 and 17 to maintain a substantially balanced condition. Maintaining transistors 16 and 17 in proper balance which, in turn, maintains transistors 151 and 152 of square-wave output stage 103 in proper balance, thereby ensuring a square-wave output signal with a duty cycle substantially equal to 50 percent.

Figure 4A:
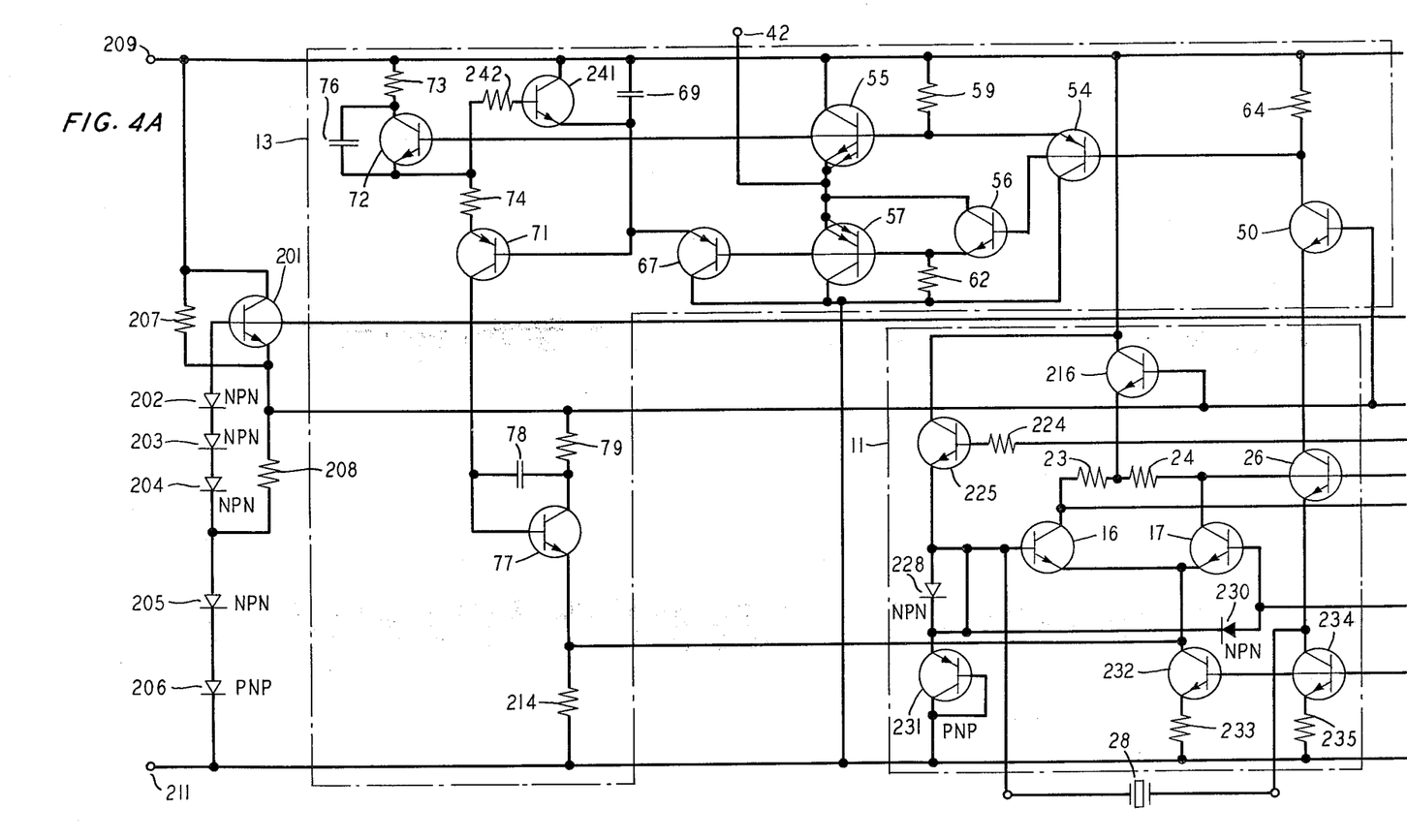
FIGS. 4A and 4B schematically depict an integrated circuit which is the preferred embodiment of this invention.
Figure 4B:
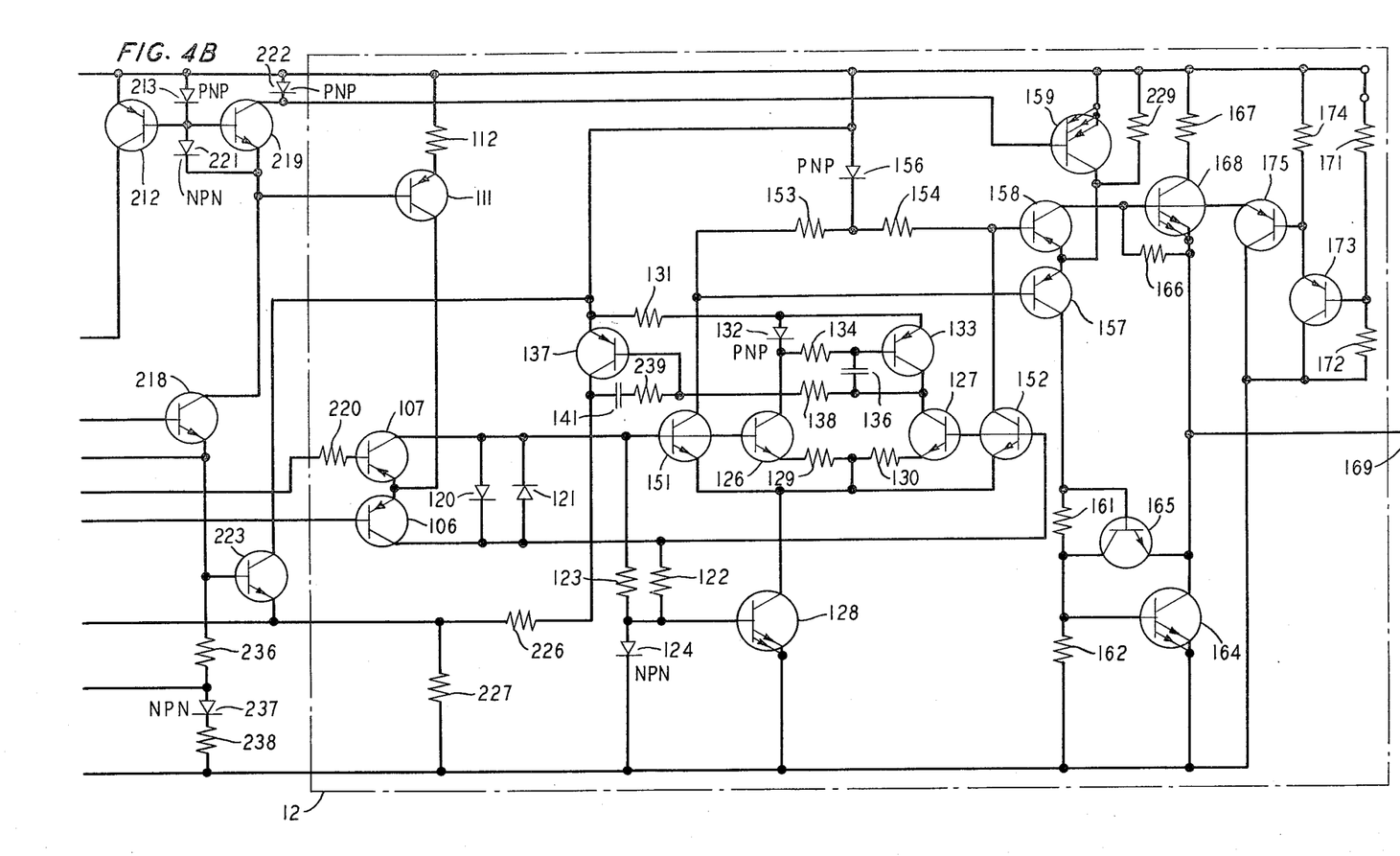

FIGS. 4A and 4B depict an integrated circuit embodiment of this invention which includes bias networks and circuit refinements to realize a fully integrated oscillator circuit having a square-wave output signal compatible with TTL (transistor-transistor logic) circuits. For convenience, circuit components identical to elements of FIGS. 1, 2, and 3 are identified by the designations utilized in FIGS. 1 to 3.

The bias circuitry depicted in FIG. 4 ensures proper circuit operation over a wide range of temperature and supply voltage. An intermediate bias voltage essentially independent of the voltage applied to terminal 209 and substantially equal to the voltage developed by four series-connected forward biased diodes is realized by the circuit comprising transistors 201, 212 and 218, diodes 202 through 206, and resistors 207, 208 and 236. Although FIG. 4 utilizes the conventional diode symbol, it will be recognized by those skilled in the art that the diodes of an integrated circuit are generally formed with appropriately connected transistors. In the practice of this invention it is advantageous to form certain diodes from a particular type of transistor. Accordingly, certain diodes of FIG. 4 are denotes as pnp or npn. When the circuit is initially energized, current flows between bias terminal 209 and 211 through the series path formed by resistors 207 and 208 and diodes 205 and 206. Since the resistance of resistor 208, is normally selected to be on the order of ten times smaller than the resistance of resistor 207, the emitter electrode of transistor 201 would normally tend to attain a potential essentially equal to the potential connected to bias terminal 211 plus two diode drops. However, current flow in transistor 218 results in current flow in diode 213 and transistor 212 which establishes the base electrode of transistor 201 at a potential substantially five diode drops above the potential applied to bias terminal 211. Accordingly, the circuit rapidly reaches a stable condition which establishes the emitter electrode of transistor 201 at a fixed voltage, e.g., 2.9 volts in the circuit of FIG. 4.

The 2.9-volt bias is connected to the collector of transistor 77 of AGC control circuit 13 via resistor 79 and is also connected to the base electrode of common base transistor 50 of AGC control and sine-wave output stage 13. In addition, the 2.9-volt bias supply is utilized to establish the base current of two transistor sources. Transistor 216, with the emitter electrode connected to the junction of resistors 23 and 24, the collector electrode connected to bias terminal 209, and the base electrode connected to the 2.9-volt bias voltage forms a voltage source which establishes the collector voltage of emitter-coupled transistors 16 and 17 of oscillator stage 11. Transistor 218, the base electrode of which is connected to the 2.9-volt bias supply, replaces transistor 116 of FIG. 3 forming a voltage source for resistor 236 which serves to establish the overall circuit bias level. Transistor 218 also acts as a reference current source for the current mirror circuits which include transistors 212 and 219 and diodes 213 and 221.

It can be noted that FIG. 4 depicts an oscillator stage 11 circuit arrangement which differs from the circuit illustrated in FIG. 1. In the circuit of FIG. 4, the dc duty cycle control signal is obtained at the collector electrode of transistor 137 and is coupled to the base electrode of transistor 17 by means of resistors 226 and 227 which are connected in series between the collector electrode of transistor 137 and bias terminal 211, with the junction between the resistors connected to the base electrode of transistor 17. With this arrangement, the collector current of transistor 137 (minus the current which flows through diode 230) is combined with the emitter current of transistor 223 to control the bias current of transistor 17 in a manner which maintains a square-wave output signal having a duty cycle of substantially 50%. Further, in FIG. 4, transistor 27 and current source 32 of the embodiment depicted in FIG. 1 have been replaced by diode-connected transistor 231 and diode 228. This arrangement advantageously decreases the effective gain of the duty cycle control loop. Transistors 232 and 234, associated with resistors 233 and 235, respectively form current sources corresponding to current sources 18 and 31 of the embodiment of FIG. 1. These transistor current sources are biased by means of resistor 236, diode 237, and resistor 238, which are series connected between the emitter electrode of transistor 218 and bias terminal 211. Diode 230 is connected between the base electrode of transistor 17 and the cathode of diode 228 to establish the quiescent bias current of transistor 17.

The square-wave output and duty cycle control circuit of FIG. 4 also departs somewhat from the circuit embodiment depicted by FIG. 3. Resistor 239 has been added in series with capacitor 141 between the collector and base electrode of transistor 137 to provide added circuit phase margin and hence additional circuit stability. In the square-wave output circuit of FIG. 4, resistor 229 has been added between the collector and emitter electrodes of current source transistor 159. Resistor 229 reduces the cross-over current in transistors 157 and 158 to further improve the symmetry of the square-wave output signal. Resistor 220, which is connected between the base electrodes of transistors 26 and 107 in FIG. 4, reduces the effect of the Miller capacitance associated with the transistor 107 to thereby minimize minimum phase shift in the oscillating loop.

AGC control stage 13 of FIG. 4 differs from the circuit embodiment depicted in FIG. 2 primarily in the addition of transistor 241 and resistor 242. Transistor 241 and resistor 242 are interconnected with the collector electrode of transistor 241 connected to bias terminal 209, the emitter electrode of transistor 241 connected to the emitter electrode of transistor 67, and the base electrode of transistor 241 connected to the emitter electrode of transistor 72 via resistor 242. This additional circuitry increases the emitter current of transistor 67 to provide reliable operation over a wide temperature range. Additionally, in the circuit of FIG. 4, the AGC control signal is obtained at the emitter electrode of transistor 77 which is connected to the collector electrode of transistor 232, with resistor 214 connected between the emitter electrode of transistor 77 and bias terminal 211. Since the collector current of transistor 232 is substantially constant, the emitter current of transistor 77 determines the total emitter current of emitter-coupled transistors 16 and 17 and hence the gain of the oscillating loop.

Since each capacitor depicted in FIG. 4 can be realized by a silicon junction capacitor, the embodiment of FIG. 4 can be fully integrated on a single silicon substrate. In fact, embodiments of FIG. 4 can be realized in which a single integrated circuit and a quartz crystal are both mounted within a single miniature container, such as a TO-8 size enclosure.

What is claimed is:
1. A crystal-controlled oscillator circuit comprising:
   an oscillator stage including a differential amplifier circuit having first and second input terminals and first and second output terminals, said differential amplifier including means responsive to an applied gain control signal for controlling the gain of said amplifier and means for connecting a piezoelectric crystal in a substantially zero phase shift feedback path between one of said amplifier output terminals and one of said amplifier input terminals;
   means responsive to the output signal of said oscillator stage for supplying a square-wave output signal to an output terminal; and
   duty cycle control means responsive to the output signal of said oscillator stage for supplying a direct current control signal to said differential amplifier circuit of said oscillator stage, said direct current control signal controlling the bias current of said oscillator stage differential amplifier to maintain the duty cycle of said square-wave output signal at substantially 50%.

2. The crystal-controlled oscillator circuit of claim 1 wherein said means for supplying a square-wave signal includes diode means for clipping said output signal of said oscillator stage and amplification means for amplifying said clipped signal.

3. The crystal-controlled oscillator circuit of claim 2 wherein said diode clipping means includes a differential amplifier emitter-coupled transistor pair with the base electrodes of said emitter-coupled pair connected to said first and second output terminals of said oscillator stage differential amplifier, and a first and second diode connected in parallel with opposite poling between the collector electrodes of said emitter-coupled transistor pair.

4. The crystal-controlled oscillator stage of claim 3 wherein said means for amplifying said clipped signal includes a differential amplifier having an emitter-coupled transistor pair with the base electrodes thereof connected to the collector electrodes of said differential amplifier emitter-coupled pair of said diode clipping means.

5. The crystal-controlled oscillator circuit of claim 4 wherein said duty cycle control means includes means for supplying a signal representative of the imbalance in the base-to-emitter voltages of said emitter coupled pair in said differential amplifier of said means for amplifying said clipped signal, said duty cycle control means further including means for filtering said representative signal to thereby form said direct current control for controlling the bias current of said oscillator stage differential amplifier.

6. The crystal-controlled oscillator circuit of claim 1 further comprising means responsive to said output signal of said oscillator stage for supplying a sinusoidal output signal to a second output terminal of said oscillator circuit.

7. The crystal-controlled oscillator of claim 6 further comprising automatic gain control means responsive to the output signal of said oscillator stage for supplying said gain control signal to said differential amplifier of said oscillator stage.

8. The crystal controlled oscillator of claim 7 wherein said automatic gain control means includes a first signal path for supplying a first signal representative of the negative peak excursions of said oscillator stage output signal, a second signal path for supplying a second signal during those periods of time in which the positive peak excursions of said oscillator stage output signal exceed a predetermined voltage, and a transistor with the base electrode thereof connected to said first signal path and the emitter electrode thereof connected to said second signal path, said automatic gain control means further including means for filtering the resulting collector current in said transistor.

9. A crystal-controlled oscillator circuit comprising:
an oscillator stage including a differential amplifier circuit having first and second input terminals and first and second output terminals, said differential amplifier circuit further including an emitter-coupled transistor pair, the emitter current of said emitter-coupled transistor pair controllable in response to a first direct current control signal, said oscillator stage further including means for connecting a piezoelectric crystal in a substantially zero phase shift feedback path between one of said amplifier output terminals and one of said amplifier input terminals;

means responsive to the output signal of said oscillator stage for supplying a sinusoidal output signal to a first oscillator output terminal;

AGC control means responsive to the output signal of said oscillator stage for supplying said first direct current control signal to said differential amplifier of said oscillator stage;

means responsive to the output signal of said oscillator stage for supplying a square-wave output signal to a second oscillator output terminal; and duty cycle control means responsive to the output signal of said oscillator stage for supplying a second direct current signal to said differential amplifier circuit of said oscillator stage, said second direct current signal controlling the base currents of said differential amplifier emitter-coupled pair to maintain the duty cycle of said square-wave output signal at substantially 50%.

10. The crystal-controlled oscillator of claim 9 wherein said sinusoidal output means includes a first transistor with the emitter electrode connected to said first output terminal of said oscillator stage differential amplifier and the base electrode connected to a first terminal of fixed potential, said sinusoidal output means further including a push-pull emitter follower circuit, the input terminal of said emitter follower circuit connected to the collector electrode of said first transistor and the output terminal of said emitter follower circuit connected to said first oscillator circuit output terminal.

11. The crystal-controlled oscillator of claim 10 wherein said push-pull emitter follower includes second, third, fourth, and fifth transistors, the base electrodes of said second and third transistors connected to said collector electrode of said first transistor, the emitter electrodes of said fourth and fifth transistors connected to said first oscillator circuit output terminal, the collector electrodes of said third and fourth transistors connected to a second terminal of fixed potential, the collector electrodes of said second and fifth transistors connected to a third terminal of fixed potential, the emitter electrode of said second transistor connected to the base electrode of said fourth transistor, said second transistor emitter electrode further connected to said second terminal of fixed potential by a first resistor, the emitter electrode of said third transistor connected to the base electrode of said fifth transistor, and said third transistor emitter electrode further connected to said third terminal of fixed potential by a second resistor.

12. The crystal-controlled oscillator circuit of claim 11 wherein said AGC control means includes sixth, seventh, eighth and ninth transistors, the base electrodes of said sixth and eighth transistors respectively connected to the emitter electrodes of said third and second transistors, the emitter electrode of said sixth transistor connected to the base electrode of said seventh transistor, the collector electrode of said sixth transistor connected to said third terminal of fixed potential, the collector electrode of said seventh transistor connected to the base electrode of said ninth transistor, and the emitter electrode of said ninth transistor connected to said oscillator stage differential amplifier circuit for controlling said emitter-coupled transistor pair emitter current, said AGC circuit further including third, fourth and fifth resistors and first, second and third capacitors, said third resistor connected between the collector electrode of said eighth transistor and said second terminal of fixed potential, said first capacitor connected between the collector and emitter electrodes of said eighth transistor, said fourth resistor connected between the emitter electrodes of said seventh and eighth transistors, said second capacitor connected between the emitter electrode of said sixth transistor and said second terminal of fixed potential, said third capacitor connected between the collector and base electrodes of said ninth transistor, and said fifth resistor connected between the collector electrode of said ninth transistor and said first terminal of fixed potential.

13. The crystal-controlled oscillator circuit of claim 12 wherein said means for supplying a square-wave output signal includes first and second diodes and a first differential amplifier circuit having an emitter-coupled transistor pair, said first and second diodes connected in parallel with opposite poling between the collector electrodes of said emitter-coupled transistors of said first differential amplifier, the base electrodes of said emitter-coupled transistors connected to said first and second output terminals of said oscillator stage differential amplifier circuit, said means for supplying a square-wave output signal further including a second differential amplifier cicuit having an emitter-coupled transistor pair with the base electrodes thereof connected to the collector electrodes of said emitter-coupled pair of said first differential amplifier, transistor current source means connected to supply the quiescent emitter current of said second differential amplifier emitter-coupled transistor amplifying means connected between the output terminals of said second differential amplifier and said oscillator second output terminal, and clamp means connected to said amplifying means for establishing the magnitude of said square-wave signal supplied to said oscillator second output terminal.

14. The crystal-controlled oscillator of claim 13 wherein said duty cycle control means includes a third differential amplifier circuit, means for amplifying the differential output current of said third differential amplifier and means for filtering said amplified differential output current, said third differential amplifier circuit including an emitter-coupled transistor pair, the base electrodes of said emitter-coupled transistors connected to the base electrodes of said second differential amplifier circuit emitter-coupled pair of said means for supplying a square-wave output signal, the emitter electrodes of said third differential amplifier emitter-coupled transistor connected to said transistor current source means of said means for supplying a square-wave output signal.

15. The crystal-controlled oscillator of claim 14 wherein said means for amplifying said differential output current of said third differential amplifier includes tenth and eleventh transistors and sixth and seventh resistors, said sixth resistor connected between the base electrode of said tenth transistor and the collector electrode of the first transistor of said duty cycle control means third differential amplifier emitter-coupled transistor pair, said seventh resistor connected between the collector electrode of said tenth transistor and the base electrode of said eleventh transistor, the emitter electrodes of said tenth and eleventh transistors connected to said second terminal of fixed potential, the collector electrode of said tenth transistor connected to the collector electrode of the second transistor of said duty cycle control means third differential amplifier emitter-coupled transistor pair, and the collector electrode of said eleventh transistor connected to supply said direct current signal to control said base currents of said oscillator stage differential amplifier.

16. The crystal-controlled oscillator of claim 15 wherein said filter means of said duty cycle control means includes a fourth and fifth capacitor, said fourth capacitor connected between the base and collector electrodes of said tenth transistor and said fifth capacitor connected between the base and collector electrodes of said eleventh transistor.

17. The crystal controlled oscillator of claim 16 wherein said amplifying means connected between said output terminals of said second differential amplifier and said oscillator second output terminal includes twelfth, thirteenth, fourteenth, fifteenth and sixteenth transistors, the base electrodes of said twelfth and thirteenth transistors respectively connected to the first and second collector electrodes of said second differential amplifier emitter-coupled transistor pair, the emitter electrodes of said twelfth and thirteenth transistors commonly connected to said second terminal of fixed potential by a second transistor current source, the base electrode of said fourteenth and fifteenth transistors respectively connected to the collector electrodes of said twelfth and thirteenth transistors, the base electrode of said sixteenth transistor connected to the collector electrode of said fourteenth transistor, the emitter electrodes of said fourteenth and fifteenth transistors and the collector electrode of said sixteenth transistor each connected to said oscillator circuit second output terminal, the emitter electrode of said sixteenth transistor connected to said third terminal of fixed potential, said amplifying means further including an eighth resistor connected between the collector and base electrodes of said fourteenth transistor, a ninth resistor connected between the base electrode of said sixteenth resistor and said third terminal of fixed potential, a tenth resistor connected between the collector electrodes of said thirteenth and sixteenth transistors, and an eleventh resistor connected between the collector electrode of said fifteenth transistor and said second terminal of fixed potential.

18. The crystal-controlled oscillator of claim 17 wherein said clamp means of said square-wave output means includes seventeenth and eighteenth transistors, the emitter electrode of said seventeenth transistor connected to the base electrode of said fifteenth transistor, the collector electrodes of said seventeenth and eighteenth transistors connected to said third terminal of fixed potential, and the base electrode of said seventeenth transistor connected to the emitter electrode of said eighteenth transistor, said clamp means further including a twelfth resistor connected between said second terminal of fixed potential and the emitter electrode of said eighteenth transistor, and thirteenth and fourteenth resistors serially connected between said second and third terminals of fixed potential, with the junction between said thirteenth and fourteenth transistors connected to the base electrode of said eighteenth transistor.

19. The crystal-controlled oscillator of claim 18 wherein each of said resistors, each of said capacitors, each of said diodes, and each of said transistors is a circuit element realized on a common silicon substrate.

* * * * *